(12) United States Patent
Richter et al.

(10) Patent No.: US 9,722,628 B2
(45) Date of Patent: Aug. 1, 2017

(54) METHOD IN A COMPUTER SYSTEM, COMPUTER PROGRAM AND DATA PROCESSING SYSTEM

(71) Applicant: SIEMENS AKTIENGESELLSCHAFT, München (DE)

(72) Inventors: Jan Richter, Lauf an der Pegnitz (DE); Maximilian Walter, Nürnberg (DE); Karl-Hermann Witte, Nürnberg (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 0 days.

(21) Appl. No.: 15/176,943

(22) Filed: Jun. 8, 2016

(65) Prior Publication Data

US 2016/0365871 A1   Dec. 15, 2016

(30) Foreign Application Priority Data

Jun. 9, 2015   (EP) .................................... 15171102

(51) Int. Cl.
*H03M 7/00* (2006.01)
*G06F 11/00* (2006.01)
*G06F 11/07* (2006.01)
*G06F 11/10* (2006.01)
*H04L 1/12* (2006.01)
*H04M 13/00* (2006.01)

(52) U.S. Cl.
CPC ............. *H03M 7/00* (2013.01); *G06F 11/008* (2013.01); *G06F 11/0796* (2013.01); *G06F 11/1004* (2013.01); *H04L 1/12* (2013.01); *H04M 13/00* (2013.01)

(58) Field of Classification Search
CPC .... H03M 7/00; G06F 11/008; G06F 11/1004; G06F 11/0796; H04M 13/00; H04L 1/12
USPC ......................................... 341/50–51; 714/48
See application file for complete search history.

(56) References Cited

U.S. PATENT DOCUMENTS 9,195,534 B2 * 11/2015 Richter ................. G06F 11/085
9,304,872 B2 *  4/2016 Schmitt ................ G06F 11/085

OTHER PUBLICATIONS

Martin Hoffmann et al.: "Experiences with software-based soft-error mitigation using AN codes"; Software Quality Journal; XP055209592; ISSN: 0963-9314, DOI:10.1007/s11219-014-9260-4; 2014.

* cited by examiner

*Primary Examiner* — Khai M Nguyen
(74) *Attorney, Agent, or Firm* — Henry M. Feiereisen LLC

(57) ABSTRACT

In a method in a computer system for recoding a coded intermediate variable into a recoded result variable a product is formed by multiplying an input constant by an input variable to be coded. The coded intermediate variable is formed as a function of the product and a multiplicative inverse is determined on the basis of the input constant. The multiplicative inverse is applied to the coded intermediate variable, so that no uncoded or partially uncoded interim result is produced and/or an error information potentially contained in the coded intermediate variable is still detectable in the interim result.

17 Claims, 1 Drawing Sheet

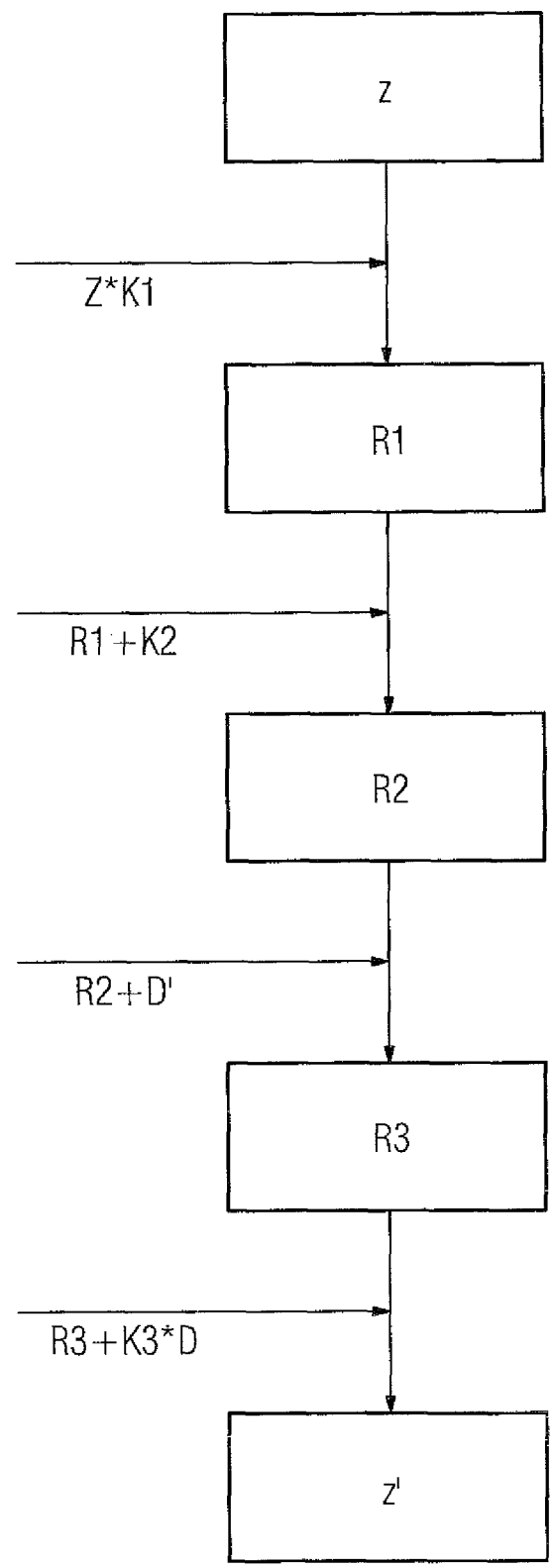

METHOD IN A COMPUTER SYSTEM, COMPUTER PROGRAM AND DATA PROCESSING SYSTEM

CROSS-REFERENCES TO RELATED APPLICATIONS

This application claims the priority of European Patent Application, Serial No. EP15171102, filed Jun. 9, 2015, pursuant to 35 U.S.C. 119(a)-(d), the disclosure of which is incorporated herein by reference in its entirety as if fully set forth herein.

BACKGROUND OF THE INVENTION

The present invention relates to a method in a computer system for recoding a coded intermediate variable into a recoded result variable, a computer program, and a data processing system.

The following discussion of related art is provided to assist the reader in understanding the advantages of the invention, and is not to be construed as an admission that this related art is prior art to this invention.

Functionally safe systems are used to reduce risks to life and health and to avoid environmental damage. As well as secure recording and communication of process information, these systems require secure processing, e.g. in programmable logic controllers or in the industrial PC.

When processing functionally secure data, internal errors in the safety function must be detected and must lead to a safety response (e.g. output of safe substitute values). This is traditionally achieved by hardware replication and result comparison. An alternative is the coding of the safety function by means of arithmetic codes.

A frequently used coding is ANBD coding in which a variable xf is coded by multiplying it by an input constant A and by adding a static, variable-dependent input signature B_x and a dynamic, cycle-dependent input operand D. Thus all numerical variables are coded according to a specification of the form:

$$z = A*xf + B\_x + D$$

and the arithmetic operations (+, −, *, /, etc.) are adapted so that processing in the coded area delivers consistent results to the original area (wherein it is quite possible for B or D also to have zero value).

In the art, checking a coded variable and recoding a variable from an ANBD code into another A'NB'D' code is only possible by completely decoding the coded variable. The decoding is done by means of: xf=(z−B_x−D)/A. A coded variable is checked by: ((z−B_x−D) MOD A==0). The result of this check is itself an uncoded variable, so that the check must be carried out on an independent item of hardware. If the method is used for recoding, an uncoded interim result is produced. Errors that affect this interim result may not always be detected. Furthermore, the error information contained in the original coded variable is lost as a result of the decoding, i.e. even an invalidly coded entry is mapped to a validly coded code word. The validity of the input operand must therefore be checked separately.

It would therefore be desirable and advantageous to address these problems and to obviate other prior art shortcomings.

SUMMARY OF THE INVENTION

According to one aspect of the present invention, a method in a computer system for recoding a coded intermediate variable into a recoded result variable includes forming a product by multiplying an input constant by an input variable to be coded, forming the coded intermediate variable as a function of the product, determining a multiplicative inverse on the basis of the input constant, and applying the multiplicative inverse to the coded intermediate variable, so that no uncoded or partially uncoded interim result is produced and/or an error information potentially contained in the coded intermediate variable is still detectable in the interim result.

According to another aspect of the present invention, a computer program includes computer executable program code recorded on a computer readable non-transitory storage medium to carry out a method as set forth above, when the computer program is executed on a computer.

According to still another aspect of the present invention, a data processing system for providing a recoded result variable from a coded intermediate variable, includes a product by multiplying an input constant by an input variable to be coded, an intermediate variable coded at least on the basis of the product, a multiplicative inverse of the input constant, the recoded result variable by applying the multiplicative inverse to the coded intermediate variable, so that no uncoded or partially uncoded interim result is produced and/or an error information potentially contained in the coded intermediate variable is still detectable in the interim result.

Until now recoding has only been possible indirectly by completely recoding the coded variable. This does however present a high risk factor. In this situation error information contained in the coded variable is lost, i.e. even an invalidly coded entry is mapped to a valid code word. The required safe processing can only be observed by additional diagnostics, which must be implemented additionally and hardware-dependently, and are therefore highly cost-intensive. According to the invention, this is now avoided.

The present invention now resolves prior art shortcomings by achieving the recoding of an intermediate variable, instead of by division, by multiplication of the multiplicative inverse to the coded intermediate variable.

The use of the multiplicative inverse in this context runs against conventional wisdom. This is based in particular on the recognition that a meaningful result is not usually produced when the operation is applied to a dividend which is not completely divisible by the divisor. This otherwise undesirable characteristic is specifically utilized here in order also to obtain an invalidly coded result in the event of an invalidly coded variable.

Unlike conventional recoding using decoding by division and subsequent recoding, no uncoded or partially uncoded interim result is produced. The method according to the present invention can therefore also be used within coded operations, even though there is no independent testing instance (redundant hardware) available there.

This characteristic is an important prerequisite for every straightforward implementation of coded processing, which takes place without additional diagnosis.

The coded intermediate variable can be advantageously formed at least by multiplying an input constant by an input variable to be coded, wherein a multiplicative inverse of the input constant is determined and wherein a product of the multiplicative inverse and a recoded result constant is applied to the coded intermediate variable, so that no uncoded or partially uncoded interim result is produced.

According to another advantageous feature of the present invention, both the input signature and/or the input operand can be constantly zero. Furthermore, other, additional input signatures and/or other, additional input operands can be used, wherein the multiplicative inverse or a product of the multiplicative inverse and a recoded result constant is then applied to the coded intermediate variable in a first step.

According to another advantageous feature of the present invention, the multiplicative inverse can have a remainder class ring modular 2powern ($\mathbb{Z}/2^n$), with n representing a bit width of the coded intermediate variable, e.g. n=32 or n=64. The multiplicative inverse can be calculated e.g. with the help of the extended Euclidean algorithm.

According to another advantageous feature of the present invention, arithmetic overruns can be ignored, thereby saving time-consuming calculation steps.

According to another advantageous feature of the present invention, the coded intermediate variable can be formed by multiplying the input variable by the input constant and by adding a static, variable-dependent input signature and a dynamic, cycle-dependent input operand, wherein the intermediate variable is recoded into a recoded result variable with a recoded result constant, a recoded, static variable-dependent result signature, and a recoded, dynamic cycle-dependent result operand, by:

creating a first interim result by multiplying the intermediate variable by a first parameter, with the first parameter being a multiplication of the multiplicative inverse with reference to the input constant and the recoded result constant, creating a second interim result by adding a second parameter to the first interim result, with the second parameter being the recoded result signature minus the multiplication of the input signature by the first interim result creating a third interim result by adding the recoded dynamic, cycle-dependent result operand to the second interim result, and creating the recoded result variable by subtracting the first parameter from the third interim result.

It is easy to detect that the functional input variable fulfills all the requirements of a coded variable in all interim results. Therefore, no uncoded interim result is produced during recoding, so that any new error that occurs is detected by the coding.

According to another advantageous feature of the present invention, any potentially existing error can be inverted by applying the multiplicative inverse.

According to another advantageous feature of the present invention, the result constant can be formed by one minus the input constant multiplied by 2powern, i.e. $A'=(1-2^n*A)$, with n being the bit width. Advantageously, the recoded static, variable-dependent result signature and the recoded, dynamic, cycle-dependent result operand can be freely selectable in addition. As a result, the recoding can be carried out in such a way that any error value potentially existing in the input is inverted. When this coding is used in the implementation in coded negation operations, an operation is established overall that does not invert the error value, since the double negation of the error cancels itself out. This makes it possible to prevent an error from being systematically masked out.

The recoded result constant can also be formed so that the input variable is replicated. In this case the result constant is advantageously formed by adding 2powern $2^n$ to one, i.e. $A'=2^n+1$, so that the input variable is replicated. In addition, the recoded static, variable-dependent result signature and the recoded dynamic, cycle-dependent result operand can be set to zero, i.e. B_x'=0 and D'=0. This coding is useful, since bitwise Boolean operations such as AND, OR or XOR can be applied directly to coded operands of this kind.

According to another advantageous feature of the present invention, the result constant can be set to one, and at the same time the recoded static, variable-dependent result signature and the recoded dynamic, cycle-dependent result operand can be set to zero, so that the recoding is a decoding of the coded intermediate variable, wherein the error information potentially contained in the coded intermediate variable is still detectable.

BRIEF DESCRIPTION OF THE DRAWING

Other features and advantages of the present invention will be more readily apparent upon reading the following description of currently preferred exemplified embodiments of the invention with reference to the accompanying drawing, in which the sole FIG. 1 shows a flow chart of an exemplary embodiment according to the present invention.

DETAILED DESCRIPTION OF PREFERRED EMBODIMENTS

The depicted embodiment is to be understood as illustrative of the invention and not as limiting in any way. It should also be understood that in certain instances, details which are not necessary for an understanding of the present invention or which render other details difficult to perceive may have been omitted.

Turning now to the drawing, and in particular to FIG. 1, there is shown a flow chart of an exemplary embodiment according to the present invention, generally designated by reference numeral 100. FIG. 1 shows the recoding of an ANBD-coded intermediate variable z=(A*xf+B_x+D) into an A'NB'D'-coded result variable z'=(A'*xf+B_x'+D'). This takes place via the following calculation steps:

Step 1: $z*K1$, with a constant $K1=A^{-1}*A'$.

This leads to the first interim result R1:

$A'*xf+A^{-1}*A'*B\_x+A^{-1}*A'*D$.

Step 2: $R1+K2$, with a constant $K2=B\_x*K1+B\_x'$.

This leads to the second interim result R2:

$A'*xf+B\_{x'+A^{-1}*A'*D}$.

Step 3: $R2+D'$.

This leads to the third interim result R3:

$A'*xf+B\_x'+A^{-1}*A^{-1}*D+D'$.

Step 4: $R3+K3*D$, with the constant $K3=-K1=-A^{-1}*A'$.

This leads to the recoded result variable z':

z': $A'*xf+B\_x'+D'$.

Overruns, if any, can be ignored. The value $A^{-1}$ signifies the multiplicative inverse of A in the remainder class ring $\mathbb{Z}$ modulo 2powern ($\mathbb{Z}/2^n$), wherein n represents the bit width of the coded intermediate variable z (e.g. n=32 or n=64). $A^{-1}$ can be calculated e.g. with the help of the extended Euclidean algorithm. As can be seen from this, all interim results R1, R2, R3 are coded. It is easy to detect that, in all interim results R1, R2, R3, the functional input variable xf is multiplied by a prime number A or A', that multiples of a static signature B_x and/or B_x' are always contained additively, and that multiples of a dynamic signature D or D' are always contained. All interim results R1,R2,R3 thus fulfill the requirements of a coded variable.

In contrast to conventional recoding by means of decoding by division and subsequent recoding, no uncoded or partially uncoded interim result is produced. The method can therefore also be used within coded operations, even though there is no independent testing instance (redundant hardware) available there. This characteristic is an important prerequisite for each straightforward implementation of coded processing, which takes place without additional diagnosis.

According to the invention, errors remain detectable. During recoding, according to the invention no uncoded interim result is produced, so that any new error occurring is detected by the coding. This is necessary at several critical points, e.g. when decoding variables while simultaneously checking for errors, when implementing negating operations without inverting the error syndrome, and when implementing bitwise Boolean operators.

A further example is the recoding of an ANBD-coded intermediate variable z=(A*xf+B_x+D+e) into an A'NB'D'-coded variable z'=(A'*xf+B_x'+D') in which A'=1, B_x'=0 and D'=0 and an error e.

This leads to the result variable:

$$z':=xf+A^{-1}*e.$$

A decoding of the operand z is obtained here as the recoding. Unlike in traditional decoding by means of division, however, an invalid coding in the input operand can be detected in the result: it is precisely in this case that the higher-value bits are not equal to 0 (positive numbers and zero) or not equal to −1 (negative numbers). This can be used in the implementation of result drivers, in that invalid values in the higher-value bits lead to the checksum of outgoing telegrams being specifically interrupted and thereby made detectable for the recipient as being erroneous.

A further example is the recoding of an ANBD-coded intermediate variable z'=(A*xf+B_x+D+e) into an A'NB'D'-coded variable z'=(A'*xf+B_x'+D') as well, wherein $A^1=(1-2^n*A)$ is selected. As a result of this the recoding is carried out in such a way that any potentially existing error value is inverted. If this coding is used in the implementation in coded negation operations, an operation is produced overall that does not invert the error value, since the double negation of the error cancels itself out. This makes it possible to prevent an error from being systematically masked out.

An additional example is the recoding of an ANBD-coded intermediate variable z=(A*xf+B_x+D+e) into an A'NB'D'-coded variable z'=(A'*xf+B_x'+D') as well, wherein A'=2n+1, B_x'=0 and D'=0 is selected. Recoding results in the replication of the uncoded value. This coding is useful, since bitwise Boolean operations such as AND, OR or XOR can be applied directly to it.

It is to be noted that D=D' is selected in many cases. The process can then be simplified to:

$$z'=(z*K1+K2)+K3*D$$

in which K1=A−1*A', K2=−Bx*K1+Bx', K3=−K1+1.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

1. A method in a computer system for recoding a coded intermediate variable into a recoded result variable, comprising:
    forming a product by multiplying an input constant by an input variable to be coded;
    forming the coded intermediate variable as a function of the product;
    determining a multiplicative inverse on the basis of the input constant; and
    applying the multiplicative inverse to the coded intermediate variable, so that no uncoded or partially uncoded interim result is produced and/or an error information potentially contained in the coded intermediate variable is still detectable in the interim result.

2. The method of claim 1, further comprising applying a product of the multiplicative inverse and a recoded result constant to the coded intermediate variable, so that no uncoded or partially uncoded interim result is produced and/or an error information potentially contained in the coded intermediate variable is still detectable in the interim result.

3. The method of claim 1, wherein an input signature and/or an input operand is constantly zero, and/or other, additional input signatures and/or other, additional input operands are used.

4. The method of claim 2, wherein the step of applying the multiplicative inverse to the coded intermediate variable or the step of applying the product of the multiplicative inverse and the recoded result constant to the coded intermediate variable represents a first step.

5. The method of claim 1, wherein the multiplicative inverse has a remainder class ring modulo 2powern, with n representing a bit width of the coded intermediate variable.

6. The method of claim 1, further comprising ignoring arithmetic overruns.

7. The method of claim 1, wherein any potentially existing error is inverted by applying the multiplicative inverse.

8. The method of claim 2, further comprising forming the result constant in such a way that the input variable is replicated.

9. The method of claim 1, wherein the coded intermediate variable is formed by multiplying the input variable by the input constant and by adding a static, variable-dependent input signature and a dynamic, cycle-dependent input operand, further comprising recoding the intermediate variable into a recoded result variable with a recoded result constant, a recoded, static variable-dependent result signature, and a recoded, dynamic cycle-dependent result operand, by:
    creating a first interim result by multiplying the intermediate variable by a first parameter, with the first parameter being a multiplication of the multiplicative inverse with reference to the input constant and the recoded result constant,
    creating a second interim result by adding a second parameter to the first interim result, with the second parameter being the recoded result signature minus the multiplication of the input signature by the first interim result
    creating a third interim result by adding the recoded dynamic, cycle-dependent result operand to the second interim result, and
    creating the recoded result variable by subtracting the first parameter from the third interim result.

10. The method of claim 9, wherein the result constant is formed by one minus the input constant multiplied by 2powern, with n being a bit width of the intermediate variable, so that any potentially existing error value is inverted.

11. The method of claim 10, wherein the recoded, static variable-dependent result signature and the recoded dynamic, cycle-dependent result operand are freely selectable.

12. The method of claim 9, wherein the result constant is replicated by adding 2powern to one, so that the input variable is replicated.

13. The method of claim 10, wherein the recoded static variable-dependent result signature and the recoded dynamic, cycle-dependent result operand (D') are set to zero.

14. The method of claim 9, wherein the result constant is set to one, and at the same time the recoded static, variable-dependent result signature and the recoded dynamic, cycle-dependent result operand are set to zero, so that the recoding is a decoding of the coded intermediate variable, wherein the error information potentially contained in the coded intermediate variable is still detectable.

15. A computer program comprising computer executable program code recorded on a computer readable non-transitory storage medium to carry out a method as claimed in claim 1, when the computer program is executed on a computer.

16. A data processing system for providing a recoded result variable from a coded intermediate variable, comprising:
   a product by multiplying an input constant by an input variable to be coded;
   an intermediate variable coded at least on the basis of the product;
   a multiplicative inverse of the input constant;
   the recoded result variable by applying the multiplicative inverse to the coded intermediate variable, so that no uncoded or partially uncoded interim result is produced and/or an error information potentially contained in the coded intermediate variable is still detectable in the interim result.

17. The data processing system of claim 16, wherein the coded intermediate variable is formed by multiplying an input variable by an input constant and by adding a static, variable-dependent input signature and a dynamic, cycle-dependent input operand, further comprising:
   provision of a first interim result by multiplying the intermediate variable by a first parameter, with the first parameter being a multiplication of the multiplicative inverse with reference to the input constant and the recoded result constant,
   provision of a second interim result by adding a second parameter to the first interim result, with the second parameter being the recoded result signature minus the multiplication of the input signature by the first interim result,
   provision of a third interim result by adding the recoded dynamic, cycle-dependent result operand to the second interim result, and
   provision of the recoded result variable by subtracting the first parameter from the third interim result.

* * * * *